United States Patent
Ohki et al.

(10) Patent No.: US 10,706,991 B2
(45) Date of Patent: Jul. 7, 2020

(54) METHOD FOR PRODUCING A SUPERCONDUCTING WIRE MATERIAL LENGTHENED

(71) Applicant: SUMITOMO ELECTRIC INDUSTRIES, LTD., Osaka-shi, Osaka (JP)

(72) Inventors: Kotaro Ohki, Osaka (JP); Tatsuoki Nagaishi, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 234 days.

(21) Appl. No.: 15/547,813

(22) PCT Filed: Feb. 3, 2016

(86) PCT No.: PCT/JP2016/053182
§ 371 (c)(1),
(2) Date: Aug. 1, 2017

(87) PCT Pub. No.: WO2016/129469
PCT Pub. Date: Aug. 18, 2016

(65) Prior Publication Data
US 2018/0025812 A1    Jan. 25, 2018

(30) Foreign Application Priority Data
Feb. 12, 2015    (JP) .................... 2015-025326

(51) Int. Cl.
*H01L 39/24* (2006.01)
*H01B 12/06* (2006.01)
(Continued)

(52) U.S. Cl.
CPC ............. *H01B 12/06* (2013.01); *H01L 39/02* (2013.01); *H01R 4/68* (2013.01)

(58) Field of Classification Search
CPC ............ H01B 12/06; H01L 39/02; H01R 4/68
See application file for complete search history.

(56) References Cited

U.S. PATENT DOCUMENTS

| | | | |
|---|---|---|---|
| 6,383,989 B2 * | 5/2002 | Jia .................... | H01L 39/128 257/E39.011 |
| 2010/0210468 A1 | 8/2010 | Lee et al. | |

(Continued)

FOREIGN PATENT DOCUMENTS

| | | |
|---|---|---|
| JP | H05-279028 A | 10/1993 |
| JP | 2011-228065 A | 11/2011 |

(Continued)

*Primary Examiner* — Paul D Kim
(74) *Attorney, Agent, or Firm* — Faegre Drinker Biddle & Reath LLP

(57) ABSTRACT

There is provided a technique for producing a superconducting wire material in which the yield in a process of joining superconducting wire materials is improved over the related art. A method for producing a superconducting wire material lengthened by joining end portions of superconducting wire materials each having an oxide superconducting film, the end portions serving as joining surfaces, includes a step of disposing a micro-crystal of an oxide superconducting material on each of the joining surfaces of the oxide superconducting films, a pasting step of overlapping and pasting together the joining surfaces on which the micro-crystal is disposed, and a heat joining step of heating the overlapped joining surfaces to grow the micro-crystal, thereby forming, as a joining layer, a superconducting layer of the oxide superconducting material to join the joining surfaces to each other. A superconducting joining member for lengthening a superconducting wire material by performing heating while the superconducting joining member is pasted so as to bridge oxide superconducting thin films of two superconducting wire materials to join the two superconducting wire materials, wherein a micro-crystal of an (Continued)

oxide superconducting material is disposed on a joining surface.

15 Claims, 4 Drawing Sheets

(51) Int. Cl.
*H01R 4/68* (2006.01)
*H01L 39/02* (2006.01)

(56) References Cited

U.S. PATENT DOCUMENTS

2017/0011823 A1* 1/2017 Jin .......................... H01R 4/68
2017/0236623 A1* 8/2017 Jin .......................... H01F 6/06
505/231

FOREIGN PATENT DOCUMENTS

| JP | 4810268 B2 | 11/2011 |
| JP | 2012028263 A * | 2/2012 |
| JP | 2013-235699 A | 11/2013 |

* cited by examiner

METHOD FOR PRODUCING A SUPERCONDUCTING WIRE MATERIAL LENGTHENED

TECHNICAL FIELD

The present invention relates to a method for producing a superconducting wire material lengthened by sequentially joining a plurality of superconducting wire materials and a superconducting joining member used for the lengthening.

BACKGROUND ART

Since the discovery of oxide superconducting materials having superconductivity at a temperature of liquid nitrogen, superconducting wire materials aimed at applications to electric power devices such as cables, current limiting devices, and magnets have been actively developed.

Long superconducting wire materials are required to produce, for example, superconducting cables and superconducting coils for superconducting apparatuses. Therefore, a plurality of superconducting wire materials are sequentially connected to each other to achieve lengthening of superconducting wire materials (e.g., refer to PTL 1 and PTL 2).

However, oxide superconducting materials for forming superconducting films of superconducting wire materials have a stable phase up to a temperature close to its melting point, but are easily decomposed at a temperature higher than its melting point. Therefore, when a plurality of superconducting wire materials are joined to each other via superconducting film surfaces, a method such as thermal diffusion treatment that is typically used for joining metals cannot be employed.

Thus, methods for joining protective layers or stabilizing layers formed on superconducting films to each other by diffusion joining with Ag or by using solder have been generally employed. However, when such a method is employed, finite resistance is generated and the joining is not achieved in a superconducting state, which poses a problem in that superconducting wire materials cannot be used in a permanent current mode.

Accordingly, the present inventors have developed a joining technique in which a superconducting layer made of an oxide superconducting material is formed on a joining surface, and superconducting film surfaces of superconducting wire materials are joined to each other via the joining surfaces (refer to PTL 3). Thus, joining can be performed in a superconducting state with zero resistance.

Specifically, this joining technique uses a metal organic deposition (MOD) method. A solution (MOD solution) containing an organic compound of a metal constituting an oxide superconducting material is applied onto the joining surface of a superconducting wire material, and temporary firing thermal treatment is performed to form a temporarily fired film serving as a precursor of the oxide superconducting material. By performing main firing thermal treatment while the temporarily fired films are pasted to each other, a superconducting layer of the oxide superconducting material is formed as a joining layer between superconducting films of two superconducting wire materials, thereby joining superconducting film surfaces to each other.

CITATION LIST

Patent Literature

PTL 1: Japanese Patent No. 4810268
PTL 2: Japanese Unexamined Patent Application Publication No. 2011-228065
PTL 3: Japanese Unexamined Patent Application Publication No. 2013-235699

SUMMARY OF INVENTION

Technical Problem

However, when the above-described joining technique in which superconducting wire materials are joined to each other by an MOD method is employed, the superconducting layer serving as a joining layer is not appropriately formed, which decreases the yield in a process of joining superconducting wire materials.

Accordingly, it is an object of the present invention to provide a superconducting wire material production technique in which the yield in a process of joining superconducting wire materials can be improved over the related art by stably forming a superconducting layer serving as a joining layer.

Solution to Problem

A method for producing a superconducting wire material according to an embodiment of the present invention is a method for producing a superconducting wire material lengthened by joining end portions of superconducting wire materials each having an oxide superconducting film, the end portions serving as joining surfaces, the method including:

a step of disposing a micro-crystal of an oxide superconducting material on each of the joining surfaces of the oxide superconducting films;

a pasting step of overlapping and pasting together the joining surfaces on which the micro-crystal is disposed; and a heat joining step of heating the overlapped joining surfaces to grow the micro-crystal, thereby forming, as a joining layer, a superconducting layer of the oxide superconducting material to join the joining surfaces to each other.

A superconducting joining member according to an embodiment of the present invention is a superconducting joining member for lengthening a superconducting wire material by performing heating while the superconducting joining member is pasted so as to bridge oxide superconducting films of two superconducting wire materials at end portions of the two superconducting wire materials to join the two superconducting wire materials, wherein a micro-crystal of an oxide superconducting material is disposed on a joining surface to be pasted to the oxide superconducting films.

Advantageous Effects of Invention

According to the present invention, there can be provided a superconducting wire material production technique in which the yield in a process of joining superconducting wire materials can be improved over the related art by stably forming a superconducting layer serving as a joining layer.

DESCRIPTION OF EMBODIMENTS

Figure 1:
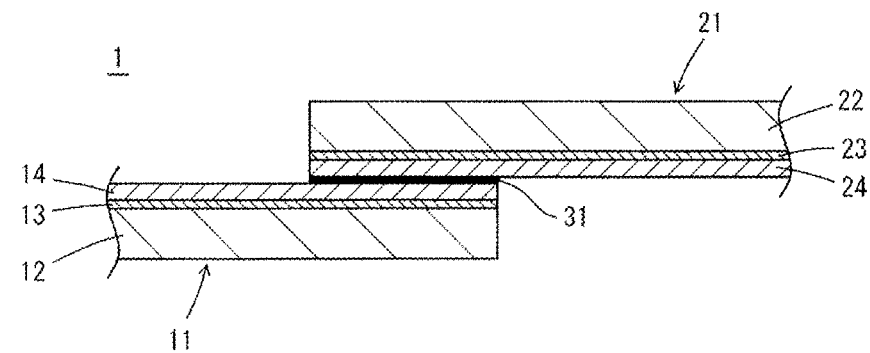
FIG. 1 is a longitudinal sectional view schematically illustrating a superconducting wire material according to an embodiment of the present invention.

Description of Embodiments of the Present Invention

First, embodiments of the present invention will be listed and described.

(1) A method for producing a superconducting wire material according to an embodiment of the present invention is a method for producing a superconducting wire material lengthened by joining end portions of superconducting wire materials each having an oxide superconducting film, the end portions serving as joining surfaces, the method including:

a step of disposing a micro-crystal of an oxide superconducting material on each of the joining surfaces of the oxide superconducting films;

a pasting step of overlapping and pasting together the joining surfaces on which the micro-crystal is disposed; and a heat-joining step of heating the overlapped joining surfaces to grow the micro-crystal, thereby forming, as a joining layer, a superconducting layer of the oxide superconducting material to join the joining surfaces to each other.

(2) In the above method for producing a superconducting wire material, the step of disposing a micro-crystal is preferably a micro-crystal generation step of generating a micro-crystal of an oxide superconducting material on each of the joining surfaces of the oxide superconducting films.

(3) In the above method for producing a superconducting wire material according to the embodiment (2), the micro-crystal generation step preferably includes:

a coat-film forming step of applying a solution containing an organic compound of a metal constituting the oxide superconducting material onto each of the joining surfaces of the oxide superconducting films to form a coat-film;

a temporary firing thermal treatment step of subjecting the coat-film to thermal treatment to thermally decompose the coat-film, thereby forming a precursor of the oxide superconducting material as a temporarily fired film; and a temporary firing film decomposition step of subjecting the temporarily fired film to thermal treatment in an atmosphere having an oxygen concentration of 1% to 100% at a temperature higher than or equal to a decomposition temperature of the temporarily fired film to decompose the temporarily fired film, thereby generating a micro-crystal of the oxide superconducting material.

The present inventors have studied the cause in which a superconducting layer of an oxide superconducting material, which serves as a joining layer, is not appropriately formed even when the joining technique for joining superconducting wire materials by an MOD method is employed and thus the yield is low in a process of joining superconducting wire materials. As a result, they have found that the cause is $CO_2$ generated when a carbon compound generated in a temporarily fired film (a precursor of an oxide superconducting material) formed during temporary firing thermal treatment is decomposed during main firing thermal treatment.

In other words, when a superconducting layer of an oxide superconducting material is formed as a joining layer by an MOD method, a carbon compound such as $BaCO_3$ is generally generated in a temporarily fired film formed during temporary firing thermal treatment. The carbon compound and residual carbon are decomposed during main firing thermal treatment and thus $CO_2$ is generated. Herein, if the main firing thermal treatment is performed in a closed system in which the temporarily fired films are pasted to each other as in the related art, $CO_2$ generated as a result of the decomposition of the carbon compound is not completely released to the outside. Consequently, the $CO_2$ concentration increases in the process of generating an oxide superconducting material in the main firing thermal treatment step, which prevents the generation of the oxide superconducting material. Superconducting film surfaces are pasted to each other while a superconducting layer is not sufficiently formed on the joining surface, which generates resistance.

The present inventors have considered that, by sufficiently decomposing and removing the carbon compound in the temporarily fired film before the superconducting film surfaces are pasted to each other, the $CO_2$ concentration is not increased during the main firing thermal treatment after the pasting and the oxide superconducting material can be sufficiently generated, and they have carried out an experiment. In this case, the carbon compound in the temporarily fired film is decomposed, but a crystal of the oxide superconducting material grows and thus the joining surfaces are not pasted to each other.

Therefore, the present inventors have further experimented and studied about a method in which $CO_2$ generated as a result of the decomposition of the temporarily fired film is appropriately released to the outside while at the same time the crystal growth of the oxide superconducting material is suppressed.

As a result, the present inventors have found the following. When the temporarily fired film is subjected to thermal treatment in an atmosphere having an oxygen concentration of 1% to 100% at a temperature higher than or equal to the decomposition temperature of the temporarily fired film, $CO_2$ generated can be appropriately released to the outside while the carbon compound in the temporarily fired film can be sufficiently decomposed. In addition, the crystal growth of the oxide superconducting material is suppressed and the crystal can be kept in a micro-crystal state. Thus, the present invention has been completed. Herein, the $CO_2$ concentration is also preferably low.

Then, a micro-crystal of the oxide superconducting material is generated on each joining surface, and the joining surfaces are pasted to each other. Since the micro-crystal of the oxide superconducting material grows during the main firing thermal treatment, a superconducting layer of the oxide superconducting material is stably formed on the joining surfaces. Consequently, joining can be achieved in a superconducting state with zero resistance.

In this embodiment, as described above, the oxygen concentration in the micro-crystal generation step is set to 1% to 100%, which is higher than the oxygen concentration (100 ppm: $10^{-4}$) in the thermal decomposition of typical temporarily fired films. The oxygen concentration is more preferably 10% to 100% and further preferably 50% to 100%.

The micro-crystal can also be generated by a method other than the MOD method. Even when another method such as a PLD method or an electron-beam deposition method is employed, the micro-crystal can be generated in the same manner.

(4) In the method for producing a superconducting wire material according to the embodiment (3), the organic compound of the metal is preferably an organometallic compound not containing fluorine.

In the case where the micro-crystal of the oxide superconducting material is generated, when a solution prepared by dissolving a fluorine-containing organometallic compound in an organic solvent is used, fluorine dissolves the superconducting layer on the joining surface. Consequently, good crystallinity cannot be achieved from a coat-film of the solution, and therefore the resistance cannot be sufficiently reduced. A solution prepared by dissolving an organometallic compound not containing fluorine in an organic solvent is preferably used because such a problem does not occur.

(5) In the method for producing a superconducting wire material according to the embodiment (1), the step of disposing a micro-crystal preferably includes:

a joining member production step of producing a joining member containing a micro-crystal of the oxide superconducting material in advance; and a joining member placing step of placing the joining member produced in advance on each of the joining surfaces of the oxide superconducting films.

As a result of further studies, the present inventors have found the following. A method for stably joining the superconducting wire materials in a superconducting state is not limited to the above-described method in which the micro-crystal generation step of generating a micro-crystal on the surface of the oxide superconducting film is performed. It is sufficient that a micro-crystal is disposed on the surface of the oxide superconducting film before the pasting step. A method in which a joining member containing a micro-crystal is separately produced and the produced joining member is placed on the oxide superconducting film is preferably employed as another method for disposing a micro-crystal on the oxide superconducting film. This is because there is no need to perform the micro-crystal generation step when the superconducting wire materials are joined to each other, which improves the work efficiency.

(6) In the method for producing a superconducting wire material according to the embodiment (5), the joining member production step preferably includes:

a coat-film forming step of applying a solution containing an organic compound of a metal constituting the oxide superconducting material onto a substrate for producing a joining member to form a coat-film;

a temporary firing thermal treatment step of subjecting the coat-film to thermal treatment to thermally decompose the coat-film, thereby forming a precursor of the oxide superconducting material as a temporarily fired film;

a temporary firing film decomposition step of subjecting the temporarily fired film to thermal treatment in an atmosphere having an oxygen concentration of 1% to 100% at a temperature higher than or equal to a decomposition temperature of the temporarily fired film to decompose the temporarily fired film, thereby generating a micro-crystal of the oxide superconducting material; and a peeling step of peeling off the generated micro-crystal from the substrate for producing a joining member to produce a joining member.

The joining member used in the above embodiment (5) is preferably produced by an MOD method. Specifically, a coat-film is formed on a substrate for producing a joining member, and the temporary firing thermal treatment step and the temporary firing film decomposition step are performed to generate a micro-crystal. By peeling off the generated micro-crystal from the substrate, a joining member containing the micro-crystal can be produced.

(7) In the method for producing a superconducting wire material according to the embodiment (6), the organic compound of the metal is preferably an organometallic compound not containing fluorine.

When the joining member is produced by the MOD method, a solution prepared by dissolving an organometallic compound not containing fluorine in an organic solvent is preferably used as in the case where the micro-crystal is directly generated on the oxide superconducting film of the superconducting wire material.

(8) In the above embodiments (1) to (7), the oxide superconducting material constituting the joining layer is preferably an oxide superconducting material in which a crystal grows at a temperature equal to or lower than a crystal growth temperature of an oxide superconducting material constituting the oxide superconducting films of the superconducting wire materials.

By forming the joining layer using an oxide superconducting material in which a crystal grows at a temperature equal to or lower than the crystal growth temperature of the oxide superconducting material constituting the oxide superconducting films, the adhesion between the joining layer and the oxide superconducting film can be improved without breaking a structure of the oxide superconducting thin film. Consequently, the superconducting wire materials can be more appropriately joined to each other.

(9) In the above embodiments (1) to (8), particles of any of Ag, Au, and Pt are preferably added to the joining layer.

The joining layer of the oxide superconducting material in the embodiments (1) to (8) can join the superconducting wire materials in a superconducting state, but sufficient joining strength sometimes cannot be achieved. In this embodiment, therefore, particles of any of Ag, Au, and Pt are added to the joining layer, and the joining layer and the oxide superconducting film are joined using such a metal material. This increases the joining strength and the separation in the joined portion can be prevented with certainty. Herein, particles of any of Ag, Au, and Pt are more preferably disposed at an interface between the joining layer and the oxide superconducting film.

(10) In the above embodiments (1) to (9), in the heat-joining step, a part of the micro-crystal is preferably caused to grow through a liquid phase.

(11) In the above embodiment (10), in the heat joining step, 30 mass % or less of the micro-crystal is caused to grow through a liquid phase.

The micro-crystal disposed on the oxide superconducting film can be caused to grow while a solid phase is maintained by performing thermal treatment at a particular temperature. However, when a part of the micro-crystal, preferably 30 mass % or less of the micro-crystal, is subjected to thermal treatment under conditions that the micro-crystal grows through a liquid phase once, the micro-crystal can be grown within a shorter time and the joining layer is formed.

(12) In the above embodiments (1) to (11), in the step of disposing a micro-crystal, the micro-crystal is preferably disposed so as to scatter on each of the joining surfaces of the oxide superconducting films.

(13) In the above embodiment (12), the micro-crystal is preferably disposed such that a gap having an area of 10% or more of an area of the joining surface is formed.

In general, when oxide superconducting materials are produced, for example, a c-axis-oriented superconducting material and an a-axis-oriented superconducting material are produced. By introducing oxygen into the c-axis-oriented superconducting material, an electric current can be caused to flow in a superconducting state. However, the joining layer is sandwiched between the oxide superconducting films of the superconducting wire materials, which makes it difficult to sufficiently introduce oxygen into the c-axis-oriented superconducting material in the joining layer. Therefore, an oxygen introducing treatment needs to be performed for a long time.

In this embodiment, the micro-crystal is disposed so as to scatter on the oxide superconducting film such that a gap is formed around the joining layer. Thus, a gas-introducing path for introducing oxygen into the joining layer is formed. Therefore, oxygen can be easily introduced into the c-axis-oriented superconducting material in the joining layer, which shortens the time for the oxygen introducing treatment.

In the case where the micro-crystal is disposed so as to scatter on the oxide superconducting film, a gap having an area of 10% or more of the area of the joining surface is preferably formed in order to more efficiently introduce oxygen.

(14) In the above embodiments (1) to (13), a ratio of a volume of a non-c-axis-oriented superconducting material in the joining layer relative to a total volume of a c-axis-oriented superconducting material and the non-c-axis-oriented superconducting material is preferably 10 to 95 vol %.

As described above, by introducing oxygen into a c-axis-oriented superconducting material among the oxide superconducting materials in the joining layer, an electric current can be caused to flow in a superconducting state. However, if the joining layer is constituted by only the c-axis-oriented superconducting material, the joining layer is excessively closely packed and the oxygen diffusion path is eliminated, which makes it difficult to introduce oxygen. Therefore, a non-c-axis-oriented superconducting material is preferably contained in the joining layer at an appropriate ratio (10 to 95 vol % and preferably 10 to 90 vol %), in addition to the c-axis-oriented superconducting material. Thus, spaces between non-c-axis-oriented crystal grains and c-axis-oriented crystal grains serve as oxygen diffusion paths, and oxygen can be appropriately introduced.

In this embodiment, the non-c-axis-oriented superconducting material refers to a material other than c-axis-oriented superconducting materials, such as a-axis-oriented superconducting materials and compounds having a phase different from that of superconducting materials. The volume ratio between the c-axis-oriented superconducting material and the non-c-axis-oriented superconducting material in the joining layer can be determined based on peak values in X-ray diffraction.

(15) In the above embodiments (1) to (14), an area of the c-axis-oriented superconducting material at an interface between the joining layer and the oxide superconducting film is preferably 10 or more times a cross-sectional area of the superconducting layer of the superconducting wire material.

As described above, the c-axis-oriented superconducting material into which oxygen has been introduced in the joining layer is a portion through which an electric current can be caused to flow in a superconducting state. Therefore, if the area of the c-axis-oriented superconducting material at an interface between the joining layer and the oxide superconducting film is not sufficiently large, sufficient Ic cannot be achieved between the joined superconducting wire materials. The critical current density of an oxide superconductor is different between the ab plane and the c-axis direction. The critical current density of the c-axis direction is $\frac{1}{10}$ the critical current density of the ab plane. Therefore, in this embodiment, the area of the c-axis-oriented superconducting material at an interface between the joining layer and the oxide superconducting film is set to 10 or more times the cross-sectional area of the superconducting layer of the superconducting wire material. Thus, the joining layer has Ic higher than or equal to that of the superconducting wire material to be joined.

(16) In the above embodiments (1) to (15), the oxide superconducting material used in formation of the joining layer is preferably a REBCO-based oxide superconducting material.

(17) In the above embodiment (16), the joining layer is preferably a joining layer containing yttria-stabilized zirconia.

In this embodiment, a joining layer containing yttria-stabilized zirconia (YSZ) is formed by adding an yttria-stabilized zirconia nanopowder to the solution used when the joining layer is formed. The YSZ has low reactivity with oxide superconducting materials and good oxygen permeability. Therefore, when such YSZ is contained, oxygen can be appropriately introduced into the c-axis-oriented superconducting material.

(18) A superconducting joining member according to an embodiment of the present invention is a superconducting joining member for lengthening a superconducting wire material by performing heating while the superconducting joining member is pasted so as to bridge oxide superconducting films of two superconducting wire materials at end portions of the two superconducting wire materials to join the two superconducting wire materials, wherein a micro-crystal of an oxide superconducting material is disposed on a joining surface to be pasted to the oxide superconducting films.

(19) In the superconducting joining member according to the embodiment (18), the micro-crystal is preferably generated through:

a coat-film forming step of applying a solution containing an organic compound of a metal constituting an oxide superconducting material onto the joining surface to form a coat-film;

a temporary firing thermal treatment step of subjecting the coat-film to thermal treatment to thermally decompose the coat-film, thereby forming a precursor of the oxide superconducting material as a temporarily fired film; and a temporary firing film decomposition step of subjecting the temporarily fired film to thermal treatment in an atmosphere having an oxygen concentration of 1% to 100% at a temperature higher than or equal to a decomposition temperature of the temporarily fired film to decompose the temporarily fired film, thereby generating a micro-crystal of the oxide superconducting material.

A superconducting wire material may be lengthened by joining two superconducting wire materials by the method for forming a joining layer between the superconducting layers of the superconducting wire materials. Alternatively, a short superconducting joining member is pasted so as to bridge oxide superconducting films at end portions of the two superconducting wire materials, and heat-joining may be performed.

Specifically, as described above, a joining surface of a short superconducting joining member in which a carbon compound is sufficiently decomposed and removed and a micro-crystal of an oxide superconducting material is generated on the joining surface in advance is pasted so as to bridge oxide superconducting films at end portions of two superconducting wire materials. Then, the superconducting joining member and the two superconducting wire materials are heat-joined. Consequently, the micro-crystal on the joining surface of the superconducting joining member grows and a superconducting layer of the oxide superconducting material is formed. Thus, two superconducting wire materials can be joined and lengthened in a superconducting state with zero resistance. The superconducting joining member is preferably produced by an MOD method, but may be produced by a method other than the MOD method. (20) A joining member according to an embodiment of the present invention is a joining member used in the method for producing a superconducting wire material according to the above embodiment (5) and containing a micro-crystal of an oxide superconducting material.

Details of Embodiments of the Present Invention

Hereafter, the present invention will be described based on embodiments with reference to the attached drawings. The present invention is not limited to these examples and is indicated by the scope of the claims. The present invention is intended to embrace equivalents of the scope of the claims and all modifications within the scope of the claims.

1. Superconducting Wire Material According to this Embodiment

FIG. 1 is a longitudinal sectional view schematically illustrating a superconducting wire material according to this embodiment. In this embodiment, as illustrated in FIG. 1, oxide superconducting films 14 and 24 of two superconducting wire materials 11 and 21 are pasted to each other with a joining layer 31 disposed therebetween to produce a lengthened superconducting wire material 1. Specifically, a superconducting layer of an oxide superconducting material is formed as a joining layer 31 on joining surfaces of the oxide superconducting film 14 of the superconducting wire material 11 and the oxide superconducting film 24 of the superconducting wire material 21, the joining surfaces facing and being overlapped each other. In FIGS. 1, 12 and 22 denote metal substrates and 13 and 23 denote intermediate layers.

As described above, two superconducting wire materials 11 and 21 are joined to each other with the joining layer 31, which serves as a superconducting layer of an oxide superconducting material, disposed therebetween. Thus, a long superconducting wire material 1 in which the generation of resistance in a joining portion is sufficiently suppressed can be produced unlike the case where superconducting wire materials are joined to each other with, for example, a protective layer or a stabilizing layer disposed therebetween.

In this embodiment, the method for forming a superconducting layer of an oxide superconducting material in the joining layer 31 is different from a known method that uses an MOD method.

Figure 2:
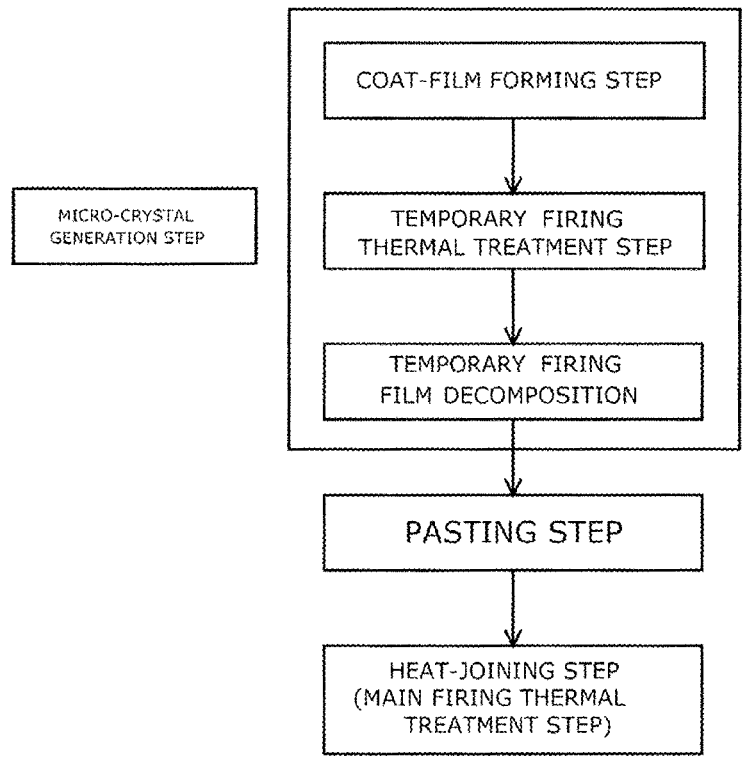
FIG. 2 illustrates steps in a method for producing a superconducting wire material according to an embodiment of the present invention.

2. Method for Producing Superconducting Wire Material According to this Embodiment FIG. 2 illustrates steps in the method for producing a superconducting wire material according to this embodiment. In this embodiment, a micro-crystal generation step of generating a micro-crystal of an oxide superconducting material is performed as a step of disposing a micro-crystal of the oxide superconducting material on an oxide superconducting film.

Herein, the description will be made by taking an MOD method as an example. As illustrated in FIG. 2, the method for producing a superconducting wire material according to this embodiment includes a coat-film forming step, a temporary firing thermal treatment step, and a temporary firing film decomposition step performed as the micro-crystal generation step, and then a pasting step. Furthermore, by forming a superconducting layer of an oxide superconducting material in the joining layer 31 illustrated in FIG. 1 through a main firing thermal treatment step serving as a heat joining step, the oxide superconducting films 14 and 24 of the two superconducting wire materials 11 and 21 are joined to each other with the joining layer 31 disposed therebetween. Thus, a lengthened superconducting wire material 1 is produced. Hereafter, each of the steps will be described in sequence.

(1) Micro-Crystal Generation Step

In this embodiment, unlike known methods, a micro-crystal generation step is performed before a step of pasting joining layers in which a temporarily fired film is formed. In this micro-crystal generation step, a micro-crystal is generated through a coat-film forming step, a temporary firing thermal treatment step, and a temporary firing film decomposition step as described below.

(a) Coat-Film Forming Step

A solution containing an organic compound of a metal constituting an oxide superconducting material is applied onto surfaces, serving as joining surfaces, of the oxide superconducting films 14 and 24 at both end portions of the two superconducting wire materials 11 and 21 in the longitudinal direction, and then dried to form a coat-film.

Such a solution is, for example, a raw material solution in an MOD method, that is, a solution prepared by dissolving, in an organic solvent, an organic compound of a metal constituting a REBCO-based (RE: rare-earth element such as Y or Gd) oxide superconducting material, such as RE, Ba, or Cu.

Specific examples of the application method include a die coating method and an ink-jet method. An application method other than those may also be employed. The solution is applied onto the entire joining surfaces of the oxide superconducting films 14 and 24, and the thickness of the solution applied is appropriately set.

(b) Temporary Firing Thermal Treatment Step

Subsequently, the dried coat-film is thermally decomposed through thermal treatment to form a precursor of the oxide superconducting material as a temporarily fired film.

Specifically, the dried coat-film is subjected to thermal treatment (temporary firing thermal treatment) at a temperature higher than or equal to the decomposition temperature of the organometallic compound and lower than the generation temperature of the oxide superconducting material.

Thus, an organometallic compound in the coat-film is thermally decomposed to form a film formed of $BaCO_3$, which is a carbon compound of Ba, a rare-earth oxide such as $Y_2O_3$, and CuO as a precursor of the oxide superconducting material and a temporarily fired film.

Herein, the specific heating temperature is preferably about 500° C., and the heating rate is preferably about 10 to 20° C./min. In the treatment atmosphere, the dew point is preferably 15° C. to 20° C. and the oxygen concentration is preferably 20% or more. The thermal treatment time is preferably about 30 minutes.

(c) Temporary Firing Film Decomposition Step

As described above, the temporarily fired film serving as a precursor of the oxide superconducting material contains a carbon compound such as $BaCO_3$. To generate an oxide superconducting material from the precursor, the carbon compound contained in the temporarily fired film needs to be decomposed.

In a known method, however, joining layers in which a temporarily fired film is formed are immediately pasted to each other, and main firing thermal treatment is performed. Consequently, the carbon compound is decomposed in an atmosphere in a closed system, and an oxide superconducting material is generated while $CO_2$ generated as a result of the decomposition is not sufficiently released to the outside.

Figure 3:
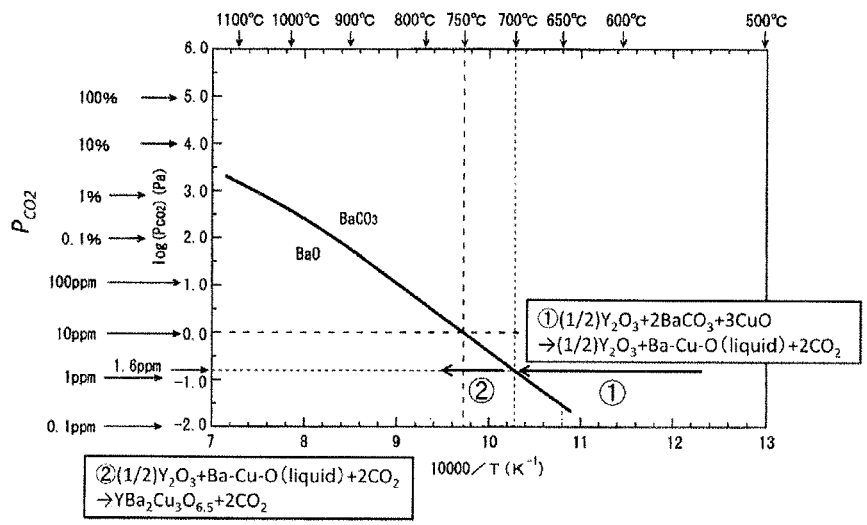
FIG. 3 illustrates a decomposition curve of $BaCO_3$.

Therefore, the $CO_2$ concentration increases in the generation process of the oxide superconducting material, which inhibits the generation of the oxide superconducting material. In other words, as illustrated in FIG. 3, $BaCO_3$ is not easily decomposed even at a high heating temperature in a high $CO_2$ concentration atmosphere. FIG. 3 is made by extracting a dissociation curve of $BaCO_3$ relating to the present invention from "Dissociation curves of carbonate groups of alkaline-earth salts" on page 387 of "Science of High Temperature Superconductivity" (SHOKABO Co., Ltd., published in 2001) edited by Masashi Tachiki and Toshizo Fujita.

In this embodiment, by performing the micro-crystal generation step before the joining layers in which a temporarily fired film is formed are pasted to each other, a carbon compound is sufficiently decomposed in an open atmosphere before pasting. By finishing, before pasting, a step through which $CO_2$ is released as described above, the generation of the oxide superconducting material is not inhibited during main firing thermal treatment, and a superconducting layer of the oxide superconducting material can be sufficiently formed in the joining layer 31.

However, if the oxygen concentration is about 100 ppm as in the related art, the crystal of the oxide superconducting material excessively grows and coarsens. Even when the pasting step and the main firing thermal treatment step are performed, the temporarily fired films are not joined to each other.

Figure 4:
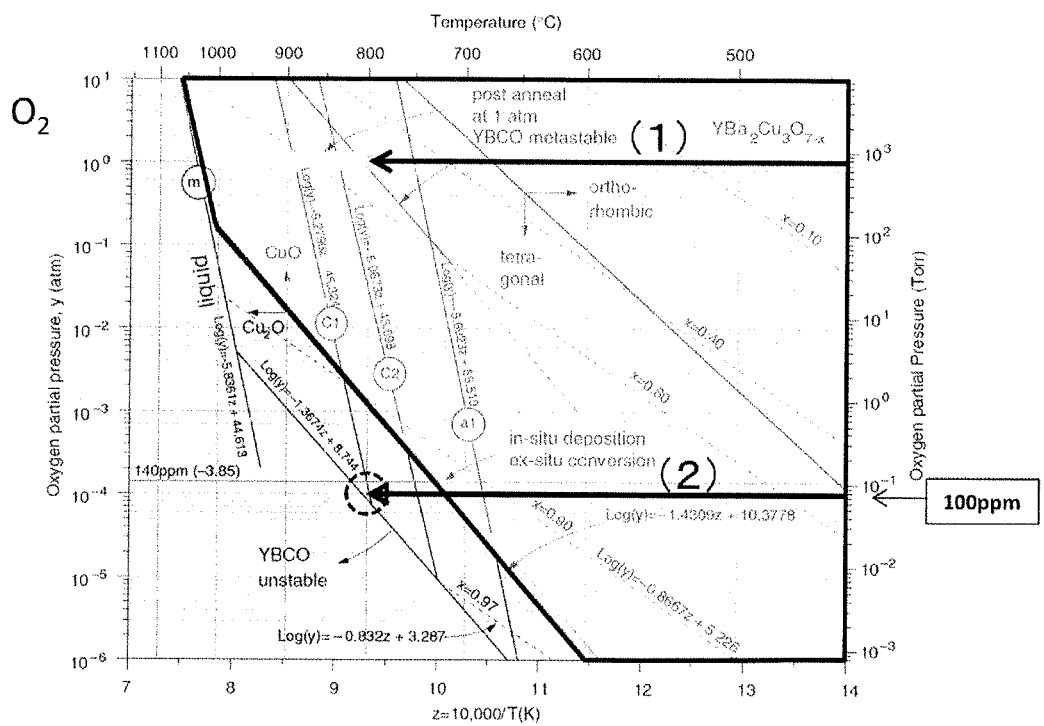
FIG. 4 is a phase diagram of YBCO.

Therefore, in this micro-crystal generation step, heating is performed in a high oxygen concentration atmosphere. The oxygen concentration ranges from an oxygen concentration higher than the oxygen concentration (100 ppm) generally set in the decomposition of $BaCO_3$ as indicated by an arrow (2) in FIG. 4, that is, an oxygen concentration of 1% to an oxygen concentration of 100% (oxygen partial pressure 1 atm) indicated by an arrow (1) in FIG. 4. FIG. 4 is a partly revised phase diagram of YBCO in FIG. 8 of J. Am. Ceram. Soc., 89[3] 914-920 (2006).

Thus, the carbon compound in the temporarily fired film can be decomposed and the micro-crystal of the oxide superconducting material can be sufficiently formed.

The heating temperature in the micro-crystal generation step is preferably 650° C. to 800° C. and more preferably 650° C. to 700° C. The heating time is preferably about 10 to 120 minutes.

(2) Pasting Step

Subsequently, the joining surfaces on which the micro-crystal of the oxide superconducting material has been generated are overlapped each other and fixed with a pressurizing jig or the like. The joining surfaces are pasted to each other by being pressed at a pressure of 1 MPa or more.

(3) Heat-Joining Step

Figure 5:
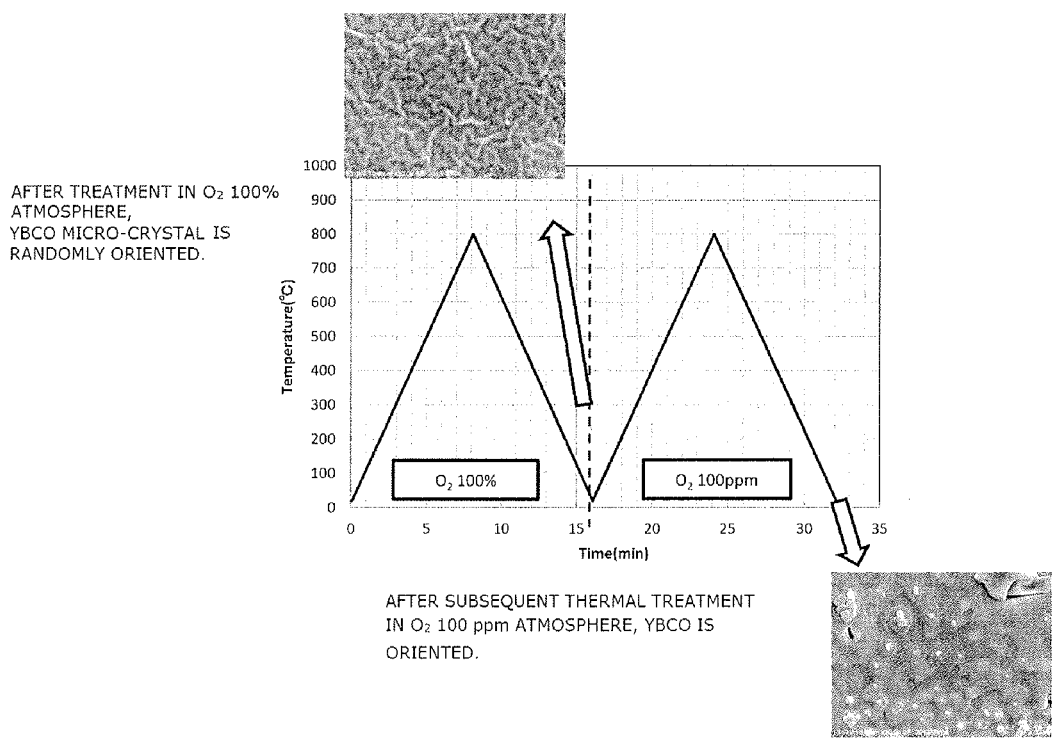
FIG. 5 illustrates a thermal treatment pattern and SEM images of a joining surface after thermal treatment.

Subsequently, a main firing thermal treatment step is performed as a heat joining step of joining the joining surfaces. In this main firing thermal treatment step, heating is performed at a temperature higher than or equal to the generation temperature of the oxide superconducting material to join the joining surfaces. Specifically, as illustrated in FIG. 5, in an Ar atmosphere with a low oxygen concentration (e.g., oxygen concentration 100 ppm), the temperature is increased to about 800° C. at a heating rate of about 100° C./min and then decreased to room temperature at substantially the same rate.

Thus, the micro-crystal of the oxide superconducting material generated in the previous step coarsens and grows so as to bridge the pasted joining layers 31. As a result, a superconducting layer of the oxide superconducting material is formed in the joining layer 31, and the oxide superconducting films 14 and 24 are joined to each other in a superconducting manner with the joining layer 31 disposed therebetween.

According to the production method of this embodiment, by performing the micro-crystal generation step before the pasting step, the micro-crystal of the oxide superconducting material is generated while the decomposition step of $BaCO_3$ through which $CO_2$ is released is finished. Therefore, in the subsequent main firing thermal treatment step, the superconducting layer of the oxide superconducting material is sufficiently formed in the joining layer 31 and the superconducting wire materials are joined to each other. Thus, a lengthened superconducting wire material can be produced.

In this embodiment, the raw material solution used for forming the joining layer 31 is preferably a solution prepared by dissolving, in an organic solvent such as an alcohol, an organic compound of a metal constituting the oxide superconducting material, such as an organometallic compound not containing fluorine, e.g., an acetylacetone metal complex.

In consideration of crystallizing the joining layer without breaking the crystal structure of the oxide superconducting films 14 and 24, the oxide superconducting material in the superconducting layer formed on the joining surface is preferably an oxide superconducting material in which the crystal grows at a temperature equal to or lower than the crystal growth temperature of the oxide superconducting material constituting the oxide superconducting films 14 and 24.

In the above embodiment, the description has been made taking an MOD method as an example, but a vapor deposition method or the like may be employed instead of the MOD method serving as a metal organic deposition method. Specific examples of the vapor deposition method that can be preferably employed include physical vapor deposition (PVD) methods such as a pulsed laser deposition (PLD) method and an electron-beam deposition method, and chemical vapor deposition (CVD) methods such as a metal organic chemical vapor deposition (MOCVD) method.

Furthermore, in the above embodiment, the superconducting wire material is lengthened by forming the joining layer between the superconducting layers of the superconducting wire materials. Alternatively, a short superconducting joining member in which a micro-crystal of an oxide superconducting material is generated on a joining surface may be produced. The superconducting joining member is pasted so as to bridge oxide superconducting thin films at end portions of two superconducting wire materials, and heat-joining is performed to lengthen the superconducting wire material.

3. Other Embodiments of the Present Invention (1) Another Embodiment of Step of Generating Micro-Crystal In the above embodiment, the micro-crystal generation step of generating a micro-crystal of an oxide superconducting material is performed as a step of disposing a micro-crystal on an oxide superconducting film, but the present invention is not limited thereto. For example, a joining member containing a micro-crystal of an oxide superconducting material is produced in a different step in advance, and the joining member may be placed on the oxide superconducting film. In such a case, a superconducting layer of an oxide superconducting material can also be stably formed on the joining surface. Consequently, the superconducting wire materials can be joined to each other in a superconducting state with zero resistance.

The joining member containing a micro-crystal can be easily produced as follows. For example, a substrate for producing a joining member is separately provided, and a solution is applied onto the substrate to form a coat-film. Then, as in the case of the above embodiment, the temporary firing thermal treatment step and the temporary firing film decomposition step are performed to generate a micro-crystal, and the generated micro-crystal is peeled off from the substrate.

Another method for producing the joining member containing a micro-crystal is a method that uses electron-beam deposition. For example, a substrate for producing a joining member is separately provided, and a raw material is deposited on the substrate by electron-beam deposition at room temperature. Then, the temperature is increased to 800° C. in a 1% to 100% oxygen atmosphere to generate a micro-crystal. By peeling off the generated micro-crystal from the substrate, the joining member containing a micro-crystal can be easily produced.

(2) Placement of Joining Auxiliary Member

In the above embodiment, the superconducting wire materials are joined to each other using only the joining layer formed of the oxide superconducting material. To reinforce the joining, a joining auxiliary member containing any of Ag, Au, and Pt is preferably placed in the joining layer.

When a micro-crystal is directly generated on the oxide superconducting film by the MOD method, for example, such a joining auxiliary member can be easily formed by adding particles of Ag, Au, or Pt to the raw material solution in the MOD method used when the micro-crystal is generated.

When the joining member containing a micro-crystal is separately produced or when a micro-crystal is generated by a method other than the MOD method, particles of Ag, Au, or Pt are placed between the joining member and the oxide superconducting film and then the heat joining step is performed. Consequently, a joining auxiliary member containing any of Ag, Au, and Pt can be formed at an interface between the joining layer and the oxide superconducting film.

(3) Conditions of Heat-Joining Step

The heat joining step of joining the joining surfaces is preferably performed under such conditions that the micro-crystal is temporarily melted and a part of the micro-crystal, preferably 30 mass % or less of the micro-crystal, is caused to grow through a liquid phase. By causing the micro-crystal to grow through a liquid phase, the micro-crystal can be grown within a short time to form the joining layer.

To cause the micro-crystal to grow through a liquid phase, the heating temperature and the heating atmosphere in the heat joining step are preferably controlled. For example, when the oxygen concentration in the heat joining step can be precisely controlled, the temperature is increased in an oxygen concentration of several parts per million (ppm) to melt the micro-crystal and form a liquid phase. Then, the oxygen concentration is changed to about 1000 ppm and the micro-crystal is rapidly coarsened and crystallized in an oriented manner. Thus, the micro-crystal can be grown within a short time. The conditions in which the micro-crystal is melted are appropriately set in accordance with, for example, the type and composition of oxide superconducting material.

(4) Formation of Gap

From the viewpoint of introducing a sufficient amount of oxygen to a c-axis-oriented superconducting material contained in the joining layer, the micro-crystal is preferably disposed so as to scatter on the oxide superconducting film in the step of disposing a micro-crystal.

For example, when the micro-crystal is directly generated on the oxide superconducting film by the MOD method as described in the above embodiment, the micro-crystal can be caused to scatter by spraying the raw material solution in the MOD method onto the oxide superconducting film. When the joining member containing a micro-crystal is separately produced, a particulate joining member is preferably disposed so as to scatter on the oxide superconducting film.

From the viewpoint of more appropriately introducing oxygen into a c-axis-oriented superconducting material, the micro-crystal is preferably disposed such that a gap having an area of 10% or more of the area of the joining surface is formed.

(5) Ratio of Non-c-Axis-Oriented Superconducting Material to c-Axis-Oriented Superconducting Material To form a joining layer containing a large amount of c-axis-oriented superconducting material into which oxygen has been introduced, the ratio of the volume of a non-c-axis-oriented superconducting material in the joining layer relative to the total volume of a c-axis-oriented superconducting material and the non-c-axis-oriented superconducting material is preferably set to 10 to 95 vol %. When the non-c-axis-oriented superconducting material is formed in the joining layer at this ratio, spaces between non-c-axis-oriented crystal grains and c-axis-oriented crystal grains serve as oxygen diffusion paths. Thus, a sufficient amount of oxygen is supplied to the c-axis-oriented superconducting material, which allows formation of a large amount of c-axis-oriented superconducting material into which oxygen has been introduced.

(6) Area of c-Axis-Oriented Superconducting Material

The critical current density of an oxide superconductor is different between the ab plane and the c-axis direction. The critical current density of the c-axis direction is $1/10$ the critical current density of the ab plane. Therefore, the area of the c-axis-oriented superconducting material at the interface between the joining layer and the oxide superconducting film needs to be 10 or more times the cross-sectional area of the superconducting layer of the superconducting wire material. Thus, the joining layer has a critical current higher than or equal to that of the superconducting wire material.

(7) Non-c-Axis-Oriented Superconducting Material

When the joining layer containing the oxide superconducting material is formed, yttria-stabilized zirconia can be incorporated into the joining layer by adding an yttria-stabilized zirconia nanopowder to the solution used when the joining layer is formed. The yttria-stabilized zirconia has low reactivity with superconducting materials and oxygen permeability, and thus oxygen can be appropriately introduced into the c-axis-oriented superconducting material.

EXPERIMENTAL EXAMPLES

The present invention will be more specifically described based on Experimental Examples.

1. First Experiment

In the first experiment, as described below, a micro-crystal of an oxide superconducting material was generated on an oxide superconducting film, and superconducting wire materials were pasted to each other. Then, the micro-crystal was grown to form a joining layer. Thus, a superconducting wire material lengthened by joining two superconducting wire materials to each other was produced. It was checked whether a superconducting layer of the oxide superconducting material was formed in the joining layer.

First, a metal substrate was provided by forming an intermediate layer having a thickness of 600 nm on a clad textured metal substrate having a thickness of 150 μm and made of Ni/Cu/SUS. A YBCO superconducting film having a thickness of 3 μm was formed on the metal substrate to produce a superconducting wire material having a width of 4 mm and a length of 100 mm.

Then, an alcohol solution containing an acetylacetone metal complex of Y, Ba, and Cu having a molar ratio of Y:Ba:Cu=1:2:3 and a total ion concentration of Y+Ba+Cu of 1 mol/L was provided. The alcohol solution was applied onto a surface of the YBCO superconducting film at both end portions of each superconducting wire material so as to have a thickness of about 25 μm and dried in the air at about 150° C. for about 10 minutes to form a coat-film (coating area: 120 mm$^2$).

Then, the superconducting film on which the coat-film was formed was placed in an atmosphere having a dew point of 15° C. to 20° C. and an oxygen concentration of 20% and heated to 500° C. at a heating rate of 2.5° C./min to form a temporarily fired film.

Then, two types of thermal treatments in the thermal treatment pattern in FIG. 5 were sequentially performed on the formed temporarily fired film. Specifically, first, the heating atmosphere was set to a high oxygen concentration atmosphere having an oxygen concentration of 100% (oxygen partial pressure 1 atm). The temperature was increased to 800° C. at a heating rate of 100° C./min for 8 minutes and then decreased to room temperature at substantially the same rate for 8 minutes (micro-crystal generation step). Subsequently, the heating atmosphere was changed to an atmosphere having an oxygen concentration of 100 ppm, and thermal treatment was performed for 16 minutes under the same heating and cooling conditions as those of the micro-crystal generation step (main firing thermal treatment step).

Surface observation that uses a scanning electron microscope (SEM) and analysis that uses 2D-XRD (X-ray diffraction) were performed on the temporarily fired film after the micro-crystal generation step and the joining layer after the main firing thermal treatment step. FIG. 5 illustrates SEM images at the upper left and the lower right and FIG. 6 illustrates the analysis results of 2D-XRD.

The SEM image at the upper left in FIG. 5 shows that a layer having surface morphology different from that of c-axis-oriented YBCO is formed on the surface of the joining layer after the micro-crystal generation step. The SEM image at the lower right in FIG. 5 shows that a coarsened crystal having an average grain size of 10 μm or more is generated on the surface of the joining layer after the main firing thermal treatment step.

Figure 6:
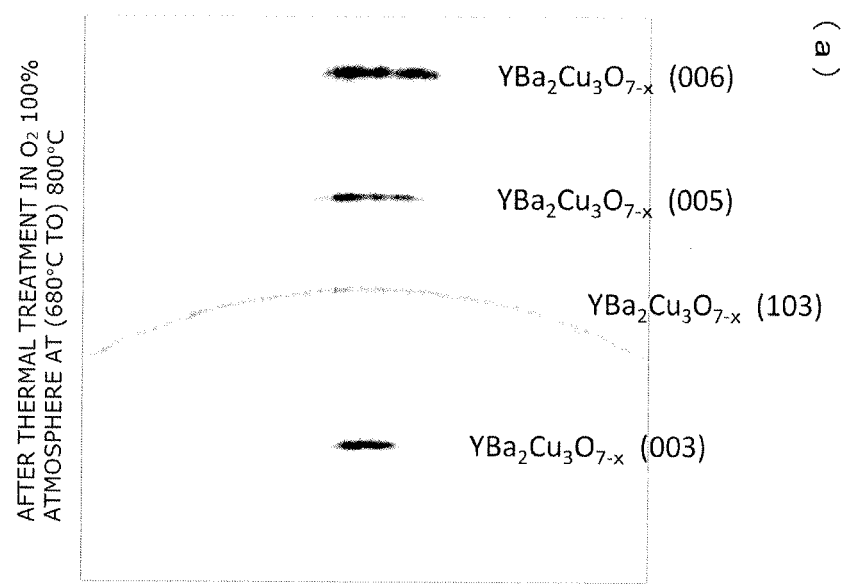
FIG. 6 illustrates the pattern and intensity of diffraction peaks of a thermal treatment product by 2D-XRD.
Figure 6:
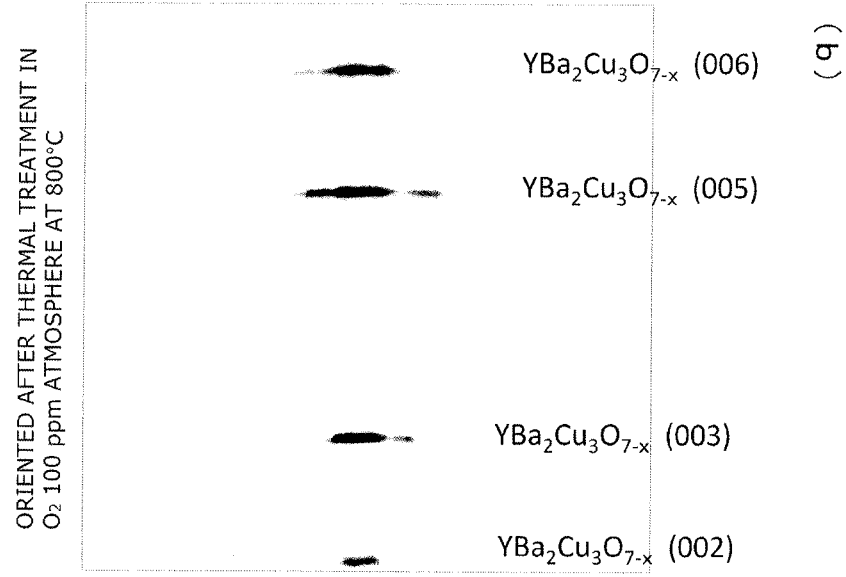

The analysis results of 2D-XRD show in a photograph in FIG. 6($a$) that, in the joining layer after the micro-crystal generation step, $BaCO_3$ is decomposed and a YBCO compound is formed while at the same time a ring pattern of $YBa_2Cu_3O_{7-x}$ (103) that indicates a non-oriented micro-crystal is generated. On the other hand, the analysis results of 2D-XRD show in a photograph in FIG. 6($b$) that, in the joining layer after the main firing thermal treatment step, the ring pattern is eliminated and the peak intensities of $YBa_2Cu_3O_{7-x}$ (002, 003, 005, and 006) are increased.

It was confirmed from the observation with a SEM and the analysis results of 2D-XRD that $BaCO_3$ in the temporarily fired film was decomposed and a non-oriented YBCO micro-crystal was generated through the micro-crystal generation step, and the non-oriented micro-crystal was coarsened to form an oriented YBCO crystal and a superconducting layer of the oxide superconducting material was formed in the joining layer through the main firing thermal treatment step.

2. Second Experiment

Next, superconducting wire materials lengthened by joining two superconducting wire materials were produced by various methods including the production methods according to the above embodiments, and the performance of the produced superconducting wire materials was evaluated.

(1) Experimental Examples 1 to 6

(a) Experimental Example 1

As in First Experiment, a micro-crystal was generated on the oxide superconducting film and a joining layer was formed from the generated micro-crystal. Thus, two superconducting wire materials (width 4 mm and length 100 mm) were joined to each other to produce a long superconducting wire material. The conditions for forming the joining layer were the same as those in First Experiment, and the joining layers were pasted to each other using a jig to produce a lengthened superconducting wire material.

(b) Experimental Example 2

A long superconducting wire material was produced by joining two superconducting wire materials under the same conditions as in Experimental Example 1, except that the heating atmosphere in the micro-crystal generation step was changed to an atmosphere having an oxygen concentration of 1%.

(c) Experimental Example 3

Two superconducting wire materials were joined by pasting temporarily fired films after the temporary firing thermal treatment to each other and performing the main firing thermal treatment without performing the micro-crystal generation step in Experimental Examples 1 and 2. Thus, a long superconducting wire material was produced. The other conditions were the same as those in Experimental Examples 1 and 2.

(d) Experimental Example 4

A long superconducting wire material was produced by joining the same superconducting wire materials as those used in Experimental Examples 1 to 3 through diffusion joining with Ag.

(e) Experimental Example 5

As in Experimental Example 4, a long superconducting wire material was produced by disposing a Ag protective layer and a Cu stabilizing layer on each superconducting wire material and joining the Cu stabilizing layers with solder.

(f) Experimental Example 6

A joining member containing a micro-crystal of a superconducting material and produced in advance was disposed between superconducting layers of two superconducting wire materials, and then the joining surfaces were heated to grow the micro-crystal. Thus, the joining surfaces were joined to each other to produce a long superconducting wire material. The other conditions were the same as those in Experimental Example 1.

(2) Evaluation

In each of Experimental Examples, the resistivity (resistivity at the joining interface) and the critical current (Ic) were measured in the joining portion between the two superconducting wire materials. The measurement was carried out by a four-terminal method at a liquid nitrogen temperature (77 K).

(3) Evaluation Results

Table 1 shows the evaluation results.

TABLE 1

| Type of joining | | Resistivity at joining interface (nΩ) | Ic (A) |
|---|---|---|---|
| Experimental Example 1 | Joining by MOD method (micro-crystal generation step in an $O_2$ concentration of 100%) | 0 | 200 |
| Experimental Example 2 | Joining by MOD method (micro-crystal generation step in an $O_2$ concentration of 1%) | 0 | 200 |
| Experimental Example 3 | Joining by MOD method (without micro-crystal generation step) | 0 | 200 |
| Experimental Example 4 | Diffusion joining with Ag | 10 | 0 |
| Experimental Example 5 | Joining with solder | 100 | 0 |
| Experimental Example 6 | Joining with joining member | 0 | 200 |

As is clear from Table 1, in all of Experimental Examples 1 to 3 and Experimental Example 6, the resistivity at the joining interface was 0 nΩ and the critical current in the joining layer was 200 A, which was substantially equal to that in the oxide superconducting film of the superconducting wire material. Thus, it was confirmed that, when the superconducting layer was formed as a joining layer by an MOD method as in Experimental Examples 1 to 3 or when joining was performed by using a joining member containing a micro-crystal of the superconducting material as in Experimental Example 6, the superconducting wire materials could be joined to each other in a superconducting state.

3. Third Experiment

Next, 20 lengthened superconducting wire materials were produced by each of the methods in Experimental Examples 1 to 3 and Experimental Example 6, and the yield in each of the methods was evaluated.

Specifically, Ic of each of the produced superconducting wire materials was measured under the same conditions as those in Second Experiment. The number of superconducting wire materials whose Ic fell below 10 A was counted to determine the yield (%). Table 2 shows the results.

TABLE 2

| Type of joining | | Yield (%) |
|---|---|---|
| Experimental Example 1 | Joining by MOD method (micro-crystal generation step in an $O_2$ concentration of 100%) | 90 |
| Experimental Example 2 | Joining by MOD method (micro-crystal generation step in an $O_2$ concentration of 1%) | 90 |
| Experimental Example 3 | Joining by MOD method (without micro-crystal generation step) | 50 |
| Experimental Example 6 | Joining with joining member | 90 |

As is clear from Table 2, high yields of 90% in Experimental Example 1, 90% in Experimental Example 2, and 90% in Experimental Example 6 were achieved whereas the yield in Experimental Example 3 was no more than 50%. Thus, it was confirmed that when the micro-crystal generation step of heating the temporarily fired film before the pasting step in a high oxygen concentration atmosphere having an $O_2$ concentration of 1% to 100% was performed as in Experimental Examples 1 and 2 or when the joining member containing a micro-crystal and produced in advance was used as in Experimental Example 6, the superconducting layer of the oxide superconducting material could be stably formed as the joining layer.

INDUSTRIAL APPLICABILITY

According to the present invention, a long superconducting wire material can be produced at a high yield by stably joining a plurality of superconducting wire materials in a superconducting state. The present invention contributes to an improvement in production efficiency of, for example, superconducting cables and superconducting coils used in a permanent current mode.

REFERENCE SIGNS LIST

1 lengthened superconducting wire material
11, 21 superconducting wire material
12, 22 metal substrate
13, 23 intermediate layer
14, 24 oxide superconducting film
31 joining layer

The invention claimed is:

1. A method for producing a superconducting wire material lengthened by joining end portions of superconducting wire materials each having an oxide superconducting film, the end portions serving as joining surfaces, the method comprising:
   a step of disposing a micro-crystal of an oxide superconducting material on each of the joining surfaces of the oxide superconducting films;
   a pasting step of overlapping and pasting together the joining surfaces on which the micro-crystal is disposed; and
   a heat-joining step of heating the overlapped joining surfaces to grow the micro-crystal, thereby forming, as a joining layer, a superconducting layer of the oxide superconducting material to join the joining surfaces to each other,
   wherein the step of disposing the micro-crystal is a micro-crystal generation step of generating the micro-crystal of the oxide superconducting material on each of the joining surfaces of the oxide superconducting films,
   wherein the micro-crystal generation step includes:
      a coat-film forming step of applying a solution containing an organic compound of a metal constituting the oxide superconducting material onto each of the joining surfaces of the oxide superconducting films to form a coat-film;
      a temporary firing thermal treatment step of subjecting the coat-film to thermal treatment to thermally decompose the coat-film, thereby forming a precursor of the oxide superconducting material as a temporarily fired film; and
      a temporary firing film decomposition step of subjecting the temporarily fired film to thermal treatment in an atmosphere having an oxygen concentration of 1% to 100% at a temperature higher than or equal to a decomposition temperature of the temporarily fired film to decompose the temporarily fired film, thereby generating the micro-crystal of the oxide superconducting material, and
   wherein a heating temperature in the temporary firing film decomposition step of subjecting the temporarily fired film to thermal treatment of the micro-crystal generation step is 650° C. to 800° C.

2. The method for producing a superconducting wire material according to claim 1, wherein the organic compound of the metal is an organometallic compound not containing fluorine.

3. The method for producing a superconducting wire material according to claim 1, wherein the oxide superconducting material constituting the joining layer is an oxide superconducting material in which a crystal grows at a temperature equal to or lower than a crystal growth temperature of an oxide superconducting material constituting the oxide superconducting films of the superconducting wire materials.

4. The method for producing a superconducting wire material according to claim 1, wherein particles of any of Ag, Au, and Pt are added to the joining layer.

5. The method for producing a superconducting wire material according to claim 1, wherein in the heat joining step, a part of the micro-crystal is caused to grow through a liquid phase.

6. The method for producing a superconducting wire material according to claim 5, wherein in the heat-joining step, 30 mass % or less of the micro-crystal is caused to grow through the liquid phase.

7. The method for producing a superconducting wire material according to claim 1, wherein in the step of disposing the micro-crystal, the micro-crystal is disposed so as to scatter on each of the joining surfaces of the oxide superconducting films.

8. The method for producing a superconducting wire material according to claim 7, wherein the micro-crystal is disposed such that a gap having an area of 10% or more of an area of the each of the joining surface is formed.

9. The method for producing a superconducting wire material according to claim 1, wherein a ratio of a volume of a non-c-axis-oriented superconducting material in the joining layer relative to a total volume of a c-axis-oriented superconducting material and the non-c-axis-oriented superconducting material is 10 to 95 vol %.

10. The method for producing a superconducting wire material according to claim 1, wherein an area of a c-axis-oriented superconducting material at an interface between the joining layer and the oxide superconducting film is 10 or more times a cross-sectional area of the superconducting layer of the superconducting wire material.

11. The method for producing a superconducting wire material according to claim 1, wherein the oxide superconducting material used in formation of the joining layer is a REBCO-based oxide superconducting material.

12. The method for producing a superconducting wire material according to claim 11, wherein the joining layer is a joining layer containing yttria-stabilized zirconia.

13. A method for producing a superconducting wire material lengthened by joining end portions of superconducting wire materials each having an oxide superconducting film, the end portions serving as joining surfaces, the method comprising:
   a step of disposing a micro-crystal of an oxide superconducting material on each of the joining surfaces of the oxide superconducting films;
   a pasting step of overlapping and pasting together the joining surfaces on which the micro-crystal is disposed; and
   a heat-joining step of heating the overlapped joining surfaces to grow the micro-crystal, thereby forming, as a joining layer, a superconducting layer of the oxide superconducting material to join the joining surfaces to each other,
   wherein the step of disposing the micro-crystal includes:
   a joining member production step of producing a joining member containing the micro-crystal of the oxide superconducting material in advance; and
   a joining member placing step of placing the joining member produced in advance on each of the joining surfaces of the oxide superconducting films.

14. The method for producing a superconducting wire material according to claim 13,
   wherein the joining member production step includes:
   a coat-film forming step of applying a solution containing an organic compound of a metal constituting the oxide superconducting material onto a substrate for producing a joining member to form a coat-film;
   a temporary firing thermal treatment step of subjecting the coat-film to thermal treatment to thermally decompose the coat-film, thereby forming a precursor of the oxide superconducting material as a temporarily fired film;
   a temporary firing film decomposition step of subjecting the temporarily fired film to thermal treatment in an atmosphere having an oxygen concentration of 1% to 100% at a temperature higher than or equal to a decomposition temperature of the temporarily fired film to decompose the temporarily fired film, thereby generating the micro-crystal of the oxide superconducting material; and a peeling step of peeling off the generated micro-crystal from the substrate for producing a joining member.

15. The method for producing a superconducting wire material according to claim 14, wherein the organic compound of the metal is an organometallic compound not containing fluorine.

\* \* \* \* \*